(12) United States Patent
Chen

(10) Patent No.: US 10,182,507 B1
(45) Date of Patent: Jan. 15, 2019

(54) SMALL FORM-FACTOR PLUGGABLE TRANSCEIVER

(71) Applicant: Axcen Photonics Corp., New Taipei (TW)

(72) Inventor: Yi-Ming Chen, Hsinchu County (TW)

(73) Assignee: AXCEN PHOTONICS CORP., New Taipei (TW)

( * ) Notice: Subject to any disclaimer, the term of this patent is extended or adjusted under 35 U.S.C. 154(b) by 0 days.

(21) Appl. No.: 15/869,828

(22) Filed: Jan. 12, 2018

(51) Int. Cl.
| | |
|---|---|
| *H01R 13/6588* | (2011.01) |
| *H05K 5/03* | (2006.01) |
| *H01R 13/633* | (2006.01) |
| *H01R 13/627* | (2006.01) |
| *H05K 9/00* | (2006.01) |
| *H05K 5/02* | (2006.01) |
| *H04B 1/40* | (2015.01) |

(52) U.S. Cl.
CPC ........... *H05K 5/03* (2013.01); *H01R 13/6272* (2013.01); *H01R 13/6335* (2013.01); *H05K 5/0221* (2013.01); *H05K 5/0247* (2013.01); *H05K 9/0015* (2013.01); *H04B 1/40* (2013.01)

(58) Field of Classification Search
CPC .......... H01R 13/6581–13/6597; H01R 13/658; H01R 13/65802; H01R 23/7073; H01R 23/688; H01R 23/6873; H05K 5/0221; H05K 5/0247; H04B 1/40
USPC ............ 439/607.05, 607.12, 607.25, 607.02, 439/607.03
See application file for complete search history.

(56) References Cited

U.S. PATENT DOCUMENTS

| | | | | |
|---|---|---|---|---|
| 6,132,244 A | * | 10/2000 | Leeman ................. | H01R 24/50 439/541.5 |
| 6,234,841 B1 | * | 5/2001 | Chang .................. | H01R 13/659 439/607.25 |
| 6,299,362 B1 | | 10/2001 | Gilliland et al. | |
| 6,887,099 B1 | * | 5/2005 | Tung ..................... | H01R 12/727 439/541.5 |
| 7,641,514 B2 | * | 1/2010 | Chen ..................... | H01R 13/518 439/540.1 |
| 8,740,647 B1 | * | 6/2014 | Cyr ....................... | H01R 23/688 439/607.12 |
| 2003/0156802 A1 | | 8/2003 | Togami et al. | |
| 2003/0198026 A1 | | 10/2003 | Bui | |
| 2010/0098427 A1 | | 4/2010 | Ice et al. | |

(Continued)

*Primary Examiner* — Gary Paumen
(74) *Attorney, Agent, or Firm* — Li & Cai Intellectual Property (USA) Office

(57) ABSTRACT

A small form-factor pluggable transceiver includes a housing, which includes an upper cover, a lower cover fastened to the upper cover, and a front plate arranged between an end of the upper cover and an end of the lower cover. The front plate, the upper cover, and the lower cover are assembled together so as to jointly define an accommodating space. The front plate includes a metallic layer defining a main surface thereof and two plastic structures connected to the metallic layer. The front plate has two through holes penetrating through the metallic layer for respectively accommodating two electrical signal connectors, and the two plastic structures are respectively arranged in the two through holes. When the two electrical signal connectors are respectively disposed in the two through holes, the plastic structures are arranged between the metallic layer and the electrical signal connectors separated from the metallic layer.

10 Claims, 11 Drawing Sheets

(56) References Cited

U.S. PATENT DOCUMENTS

2012/0071029 A1* 3/2012 Millevik .................. F16L 5/08
439/607.25

* cited by examiner

SMALL FORM-FACTOR PLUGGABLE TRANSCEIVER

BACKGROUND OF THE INVENTION

1. Field of the Invention

The present disclosure relates to a pluggable transceiver; in particular, to a small form-factor pluggable (SFP) transceiver.

2. Description of Related Art

Conventional SFP transceiver is provided with a metallic housing to shield external electromagnetic interference. However, the end portion of the conventional SFP transceiver provided with at least one electrical signal connector still has serious electromagnetic interference.

SUMMARY OF THE INVENTION

The present disclosure provides a small form-factor pluggable (SFP) transceiver to solve the drawbacks associated with conventional SFP transceivers (e.g., an end portion of conventional SFP transceiver, which is provided with at least one electrical signal connector, still has a serious electromagnetic interference).

The present disclosure discloses a small form-factor pluggable (SFP) transceiver for being inserted into an electrical connection slot of an electronic apparatus. The SFP transceiver includes a housing, which includes an upper cover, a lower cover fastened to the upper cover, and a front plate arranged between an end of the upper cover and an end of the lower cover. The front plate, the upper cover, and the lower cover are assembled together so as to jointly define an accommodating space. The front plate includes a metallic layer substantially defining a main surface thereof and two plastic structures connected to the metallic layer. The front plate has two through holes penetrating through the metallic layer for respectively accommodating two electrical signal connectors. The two plastic structures are respectively arranged in the two through holes. When the two electrical signal connectors are respectively disposed in the two through holes, the two plastic structures are arranged between the metallic layer and the two electrical signal connectors, and the two electrical signal connectors are separated from the metallic layer by the two plastic structures. Two opposite ends of the housing are respectively defined as a front end and a rear end, and the front plate is located at the front end.

In summary, the SFP transceiver of the present disclosure can be provided for effectively reducing an external electromagnetic interference by the arrangement of the metallic layer and the plastic structures.

In order to further appreciate the characteristics and technical contents of the present disclosure, references are hereunder made to the detailed descriptions and appended drawings in connection with the present disclosure. However, the appended drawings are merely shown for exemplary purposes, and should not be construed as restricting the scope of the present disclosure.

BRIEF DESCRIPTION OF THE DRAWINGS

FIG. 1A is a front view of FIG. 1;

DETAILED DESCRIPTION OF THE PREFERRED EMBODIMENTS

First Embodiment

Reference is made to FIGS. 1 to 5, which illustrate a first embodiment of the present disclosure. The present embodiment discloses a small form-factor pluggable (SFP) transceiver 1, which can be electrically connected to two electrical signal wires and inserted into an electrical connection slot of an electronic apparatus, e.g., a switch or a router so that electrical signals from the two electrical signal wires can be converted by the SFP transceiver 1, and then be transmitted to the electronic apparatus through the SFP transceiver 1.

Figure 1:
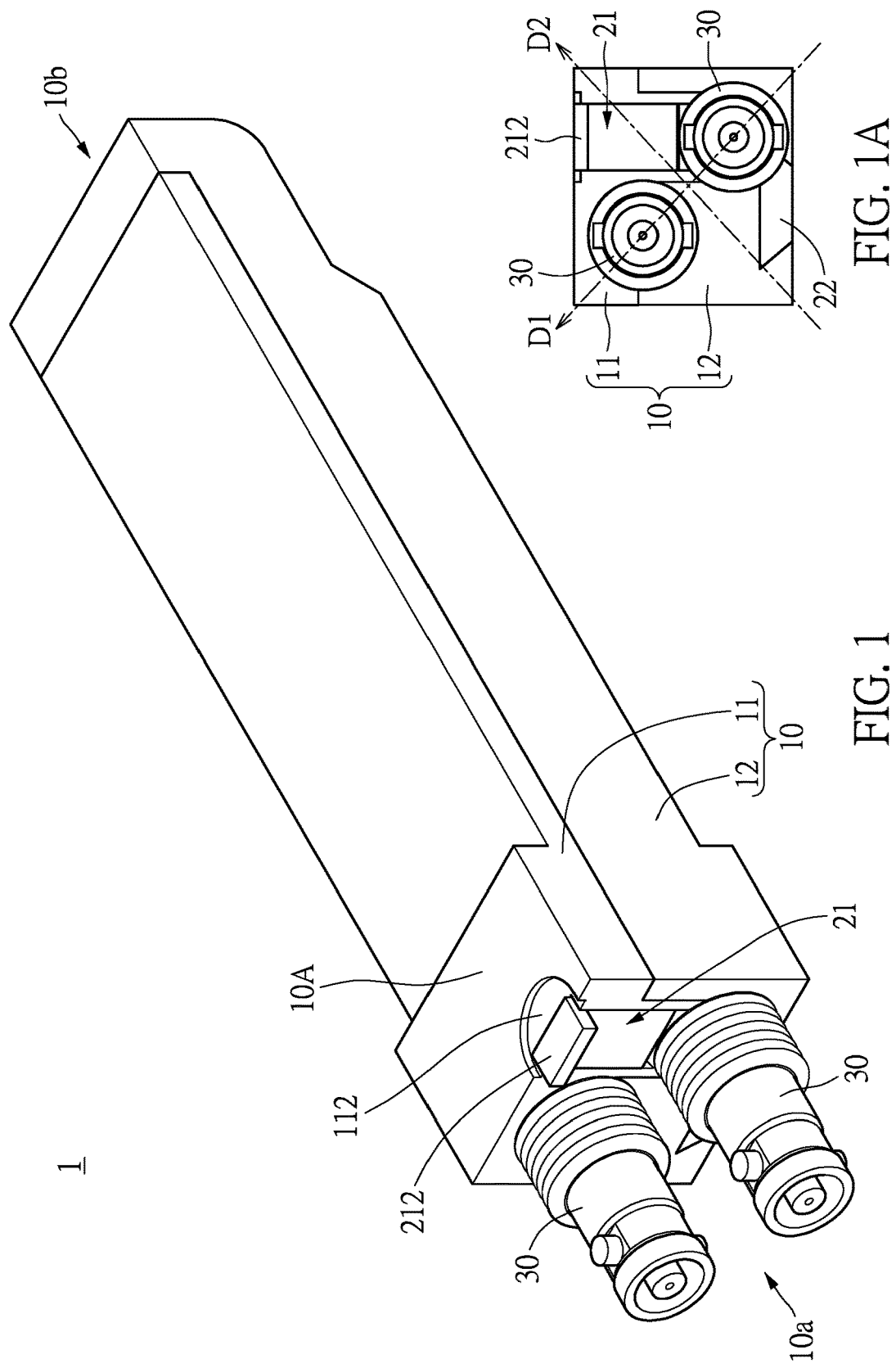
FIG. 1 is a perspective view showing a small form-factor pluggable (SFP) transceiver according to a first embodiment of the present disclosure.
Figure 2:
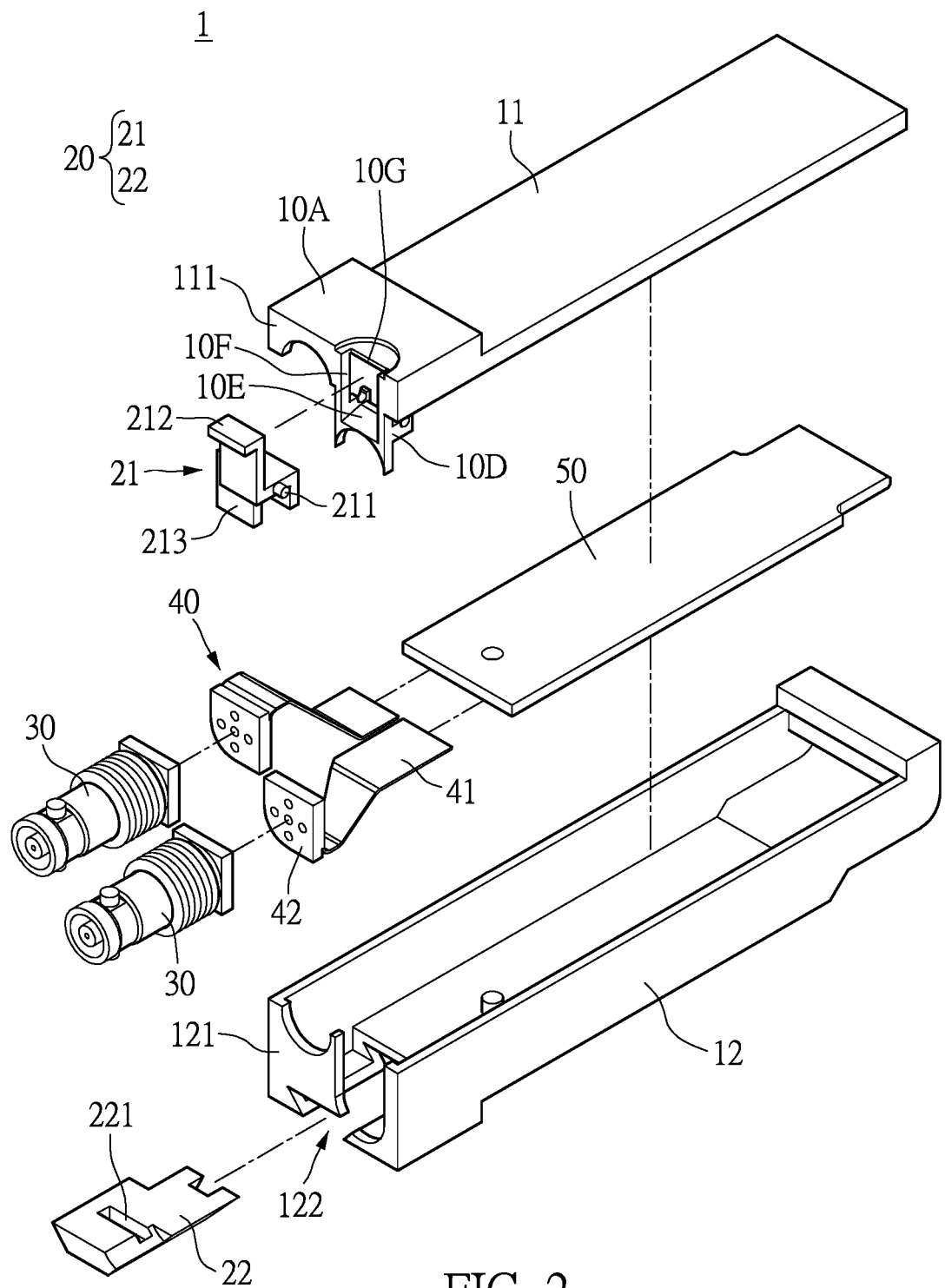
FIG. 2 is an exploded view of FIG. 1.
Figure 3:
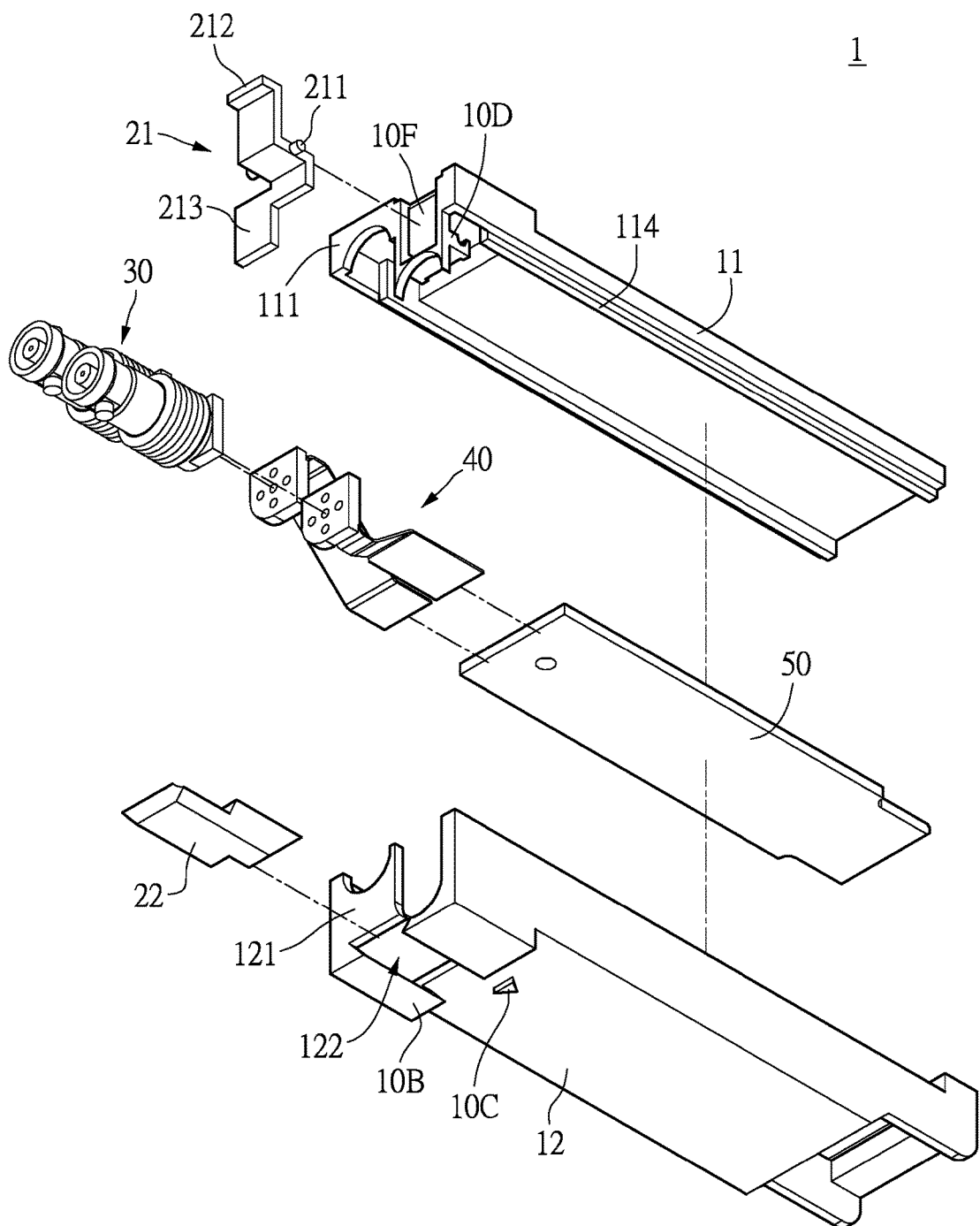
FIG. 3 is an exploded view of FIG. 1 from another perspective.
Figure 4:
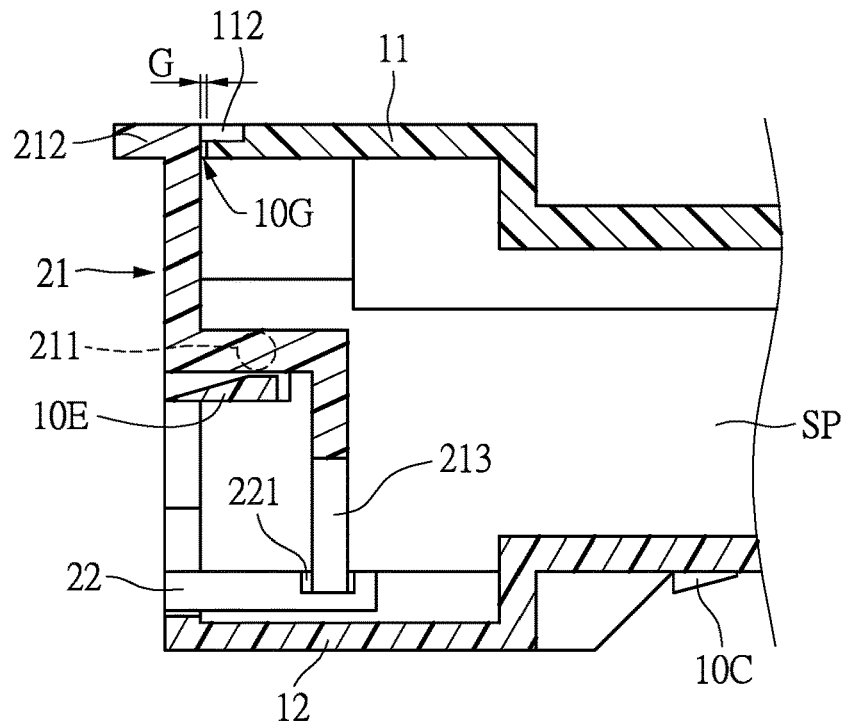
FIG. 4 is a cross-sectional view of the SFP transceiver according to the first embodiment of the present disclosure.

As shown in FIGS. 1 to 3, the SFP transceiver 1 includes a housing 10, an unlocking assembly 20, two electrical signal connectors 30, two flexible assemblies 40, and a circuit board 50. The housing 10 includes an upper cover 11 and a lower cover 12. The upper cover 11 and the lower cover 12 in the present embodiment are connected to each other so as to form the housing 10 defining an accommodating space SP therein, as shown in FIG. 4. The two flexible assemblies 40 and the circuit board 50 are arranged in the accommodating space SP. In practical applications, the upper cover 11 and/or the lower cover 12 can be made of an anti-electromagnetic interference material, such as zinc alloy, but the present disclosure is not limited thereto. The connection mechanism between the upper cover 11 and the lower cover 12 can be determined according to design requirements. For example, the connection mechanism between the upper cover 11 and the lower cover 12 can be an engaging connection, an adhering connection, or a soldering connection.

The housing 10 has a front end 10a, a rear end 10b opposite the front end 10a, a top surface 10A, and a bottom surface 10B opposite the top surface 10A. The top surface 10A is a surface of the upper cover 11 arranged away from the lower cover 12, and the bottom surface 10B is a surface of the lower cover 12 arranged away from the upper cover 11. The front end 10a of the housing 10 is fastened to the two electrical signal connectors 30, and the rear end 10b of the housing 10 is inserted into the electrical connection slot of the electronic apparatus. The housing 10 has an engaging portion 10C outwardly protruding from the bottom surface 10B. When the SFP transceiver 1 is inserted into the electrical connection slot, the engaging portion 10C is engaged with a mating structure of the electrical connection slot, thereby firmly fastening the SFP transceiver 1 to the electrical connection slot.

The upper cover 11 has an upper front plate 111 located at the front end 10a of the housing 10, and the lower cover 12 has a lower front plate 121 located at the front end 10a of the housing 10. When the upper cover 11 is connected to the lower cover 12, and the upper front plate 111 and the lower front plate 121 are jointly defined as a front plate 13. The two electrical signal connectors 30 and part of the unlocking assembly 20 are disposed on the front plate 13. The upper front plate 111 and the lower front plate 121 are respectively formed with two openings for accommodating the two electrical signal connectors 30. In a preferred embodiment, when the upper front plate 111 and the lower front plate 121 are connected to each other, the two electrical signal connectors 30 are seamlessly connected to the front plate 13. The housing 10 includes a front opening 10F and a top opening 10G, and the front opening 10F and the top opening 10G in the present embodiment are in air-communication with each other. The front opening 10F can be formed in a portion of the front plate 13 adjacent to the upper cover 11, and the top opening 10G can be formed in a portion of the upper cover 11 adjacent to the front plate 13. In the present embodiment, the front opening 10F is formed in the upper front plate 111.

The unlocking assembly 20 includes an unlocking member 21 and an interlock member 22. The unlocking member 21 includes a pivotal portion 211, a manipulating portion 212, and a driving portion 213. The pivotal portion 211 of the unlocking member 21 is pivotally connected to the front plate 13. The housing 10 can include a pivotal structure 10D, and the pivotal portion 211 of the unlocking member 21 is pivotally connected to the pivotal structure 10D. In the present embodiment, the pivotal structure 10D is arranged on the upper front plate 111 and faces the accommodating space SP, and the pivotal portion 211 of the unlocking member 21 is pivotally connected to the pivotal structure 10D of the front plate 13. In other embodiments of the present disclosure, the pivotal structure 10D can be arranged on the lower front plate 121, or the pivotal structure 10D can be arranged on both of the upper front plate 111 and the lower front plate 121.

When the unlocking member 21 is pivotally connected to the front plate 13, the manipulating portion 212 is exposed at the front end 10a of the housing 10. Specifically, a part of the manipulating portion 212 is exposed at the top surface 10A of the housing 10, and the driving portion 213 is arranged in the accommodating space SP of the housing 10. Accordingly, the part of the manipulating portion 212 exposed at the top surface 10A is easily reachable such that the unlocking member 21 can be rotated in a direction away from the upper cover 11 and the front plate 13.

In the present embodiment, the pivotal portion 211 of the unlocking member 21 is a shaft, and the pivotal structure 10D of the upper front plate 111 is a groove corresponding in shape to the shaft, but the present disclosure is not limited thereto. As shown in FIG. 1, the upper cover 11 includes a concavity 112 formed on a portion of the top surface 10A and adjacent to the top opening 10G. The part of the manipulating portion 212 exposed at the top surface 10A is arranged in the concavity 112 so that the manipulating portion 212 of the unlocking member 21 can be rotated easily.

Specifically, when the unlocking member 21 is pivotally connected to the front plate 13, the unlocking member 21 covers the front opening 10F and the top opening 10G, and a distance G (as shown in FIG. 4) between the unlocking member 21 and a side wall defining the top opening 10G is less than 0.5 mm, thereby effectively reducing electromagnetic interference caused by external signals entering the housing 10. Preferably, the unlocking member 21 can be made of an anti-electromagnetic interference material. In practical applications, the unlocking member 21 and the housing 10 are made of zinc alloy, thereby effectively reducing electromagnetic interference. The concavity 112 can be in air-communication with the top opening 10G, and the manipulating portion 212 corresponds in position to the concavity 112 and the top opening 10G.

Figure 5:
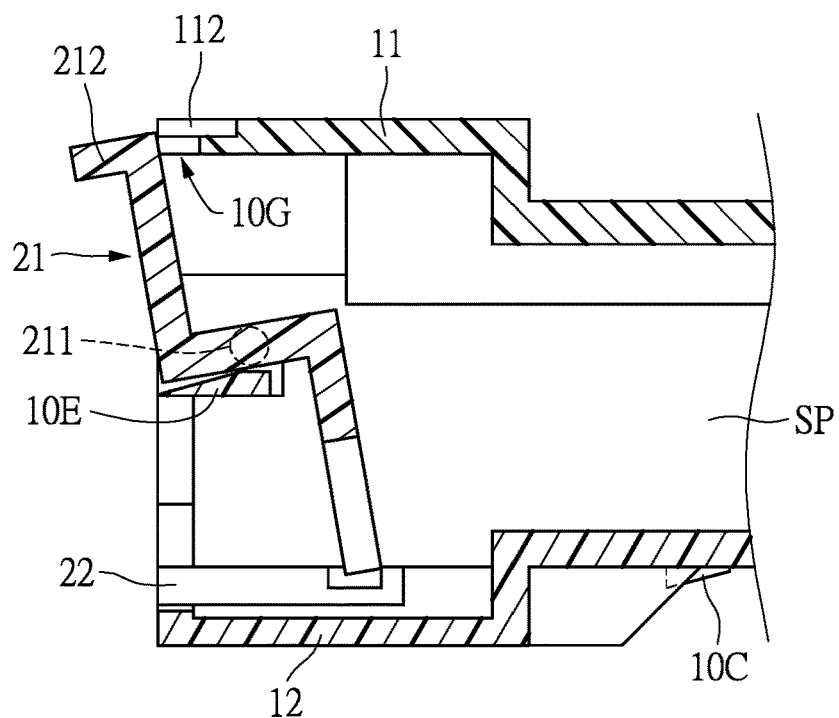
FIG. 5 is a cross-sectional view showing the SFP transceiver of FIG. 4 in operation.

The interlock member 22 can be disposed on the lower cover 12 and is connected to the driving portion 213 of the unlocking member 21. As shown in FIGS. 4 and 5, when the manipulating portion 212 of the unlocking member 21 is rotated away from the housing 10 by an external force, the unlocking member 21 moves the interlock member 22 toward the engaging portion 10C with the driving portion 213 such that the interlock member 22 presses the mating structure of the electrical connection slot engaged with the engaging portion 10C, thereby releasing the engaging portion 10C from the engagement with the electrical connection slot. Afterwards, the SFP transceiver 1 can be retracted from the electrical connection slot.

Specifically, the housing 10 includes a grooved track 122 formed on the bottom surface 10B or on one side of the lower cover 12 arranged away from the upper cover 11, and the track 122 is in air-communication with the accommodating space SP. The interlock member 22 is slidably arranged in the track 122, a side portion of the interlock member 22, i.e., the left side portion of the interlock member 22 as shown in FIG. 4, is arranged in the accommodating space SP, and the interlock member 22 includes a slot 221 formed on the side portion thereof. The driving portion 213 of the unlocking member 21 is engaged with the slot 221. When the unlocking member 21 is rotated relative to the housing 10 by the external force, the driving portion 213 presses an inner wall of the slot 221 such that the interlock member 22 is moved relative to the housing 10.

In practical applications, the housing 10 further includes a limiting structure 10E configured to limit a rotation angle of the unlocking member 21 with respect to the housing 10. The limiting structure 10E can be arranged adjacent to the pivotal structure 10D and can be arranged on the front plate 13. Moreover, the limiting structure 10E is preferably configured to limit the rotation angle of the unlocking member 21 to a range of 15 to 30 degrees. For example, when the manipulating portion 212 of the unlocking member 21 is rotated away from the housing 10, a part of the unlocking member 21 abuts against a slanting surface of the limiting structure 10E and is therefore limited by the limiting structure 10E. In practical applications, the pivotal structure 10D can be integrally formed as a one-piece unit with the limiting structure 10E.

As shown in FIG. 1A, the two electrical signal connectors 30 are arranged along a first diagonal of the front plate 13, and the unlocking member 22 is arranged along a second diagonal of the front plate 13. In other words, in the front view, the unlocking member 22 is arranged on an upper right side of the front plate 13 so that the relative position between the unlocking member 22 and the housing 10 can be observed from an upper side of the housing 10 (or the top surface 10A). Thus, the engagement and the disengagement between the SFP transceiver 1 and the electrical connection slot can be directly and easily observed from the top surface 10A of the SFP transceiver 1. Specifically, FIG. 4 shows the engagement between the SFP transceiver 1 and the electrical connection slot, in which the unlocking member 21 substantially covers the top opening 10G. FIG. 5 shows the disengagement between the SFP transceiver 1 and the electrical connection slot, in which the unlocking member 22 is tilted with respect to the housing 10 and protrudes from the front end 10a of the housing 10, and the top opening 10G is mostly uncovered.

Second Embodiment

Reference is made to FIGS. 6 to 9, which illustrate the SFP transceiver 1' according to a second embodiment of the present disclosure. The SFP transceiver 1' in the present embodiment includes a housing 10, an unlocking assembly 20, two electrical signal connectors 30, two flexible assemblies 40, and a circuit board 50. The following description discloses the difference between the present embodiment and the first embodiment.

In the present embodiment, the housing 10 is formed by assembling an upper cover 11, a lower cover 12, and a front plate 13 together, in which the front plate 13 is at the front end 10a of the housing 10. The upper cover 11, the lower cover 12, and the front plate 13 are three independent components, and the connection mechanisms therebetween can be determined respectively according to design requirements.

Figure 8:
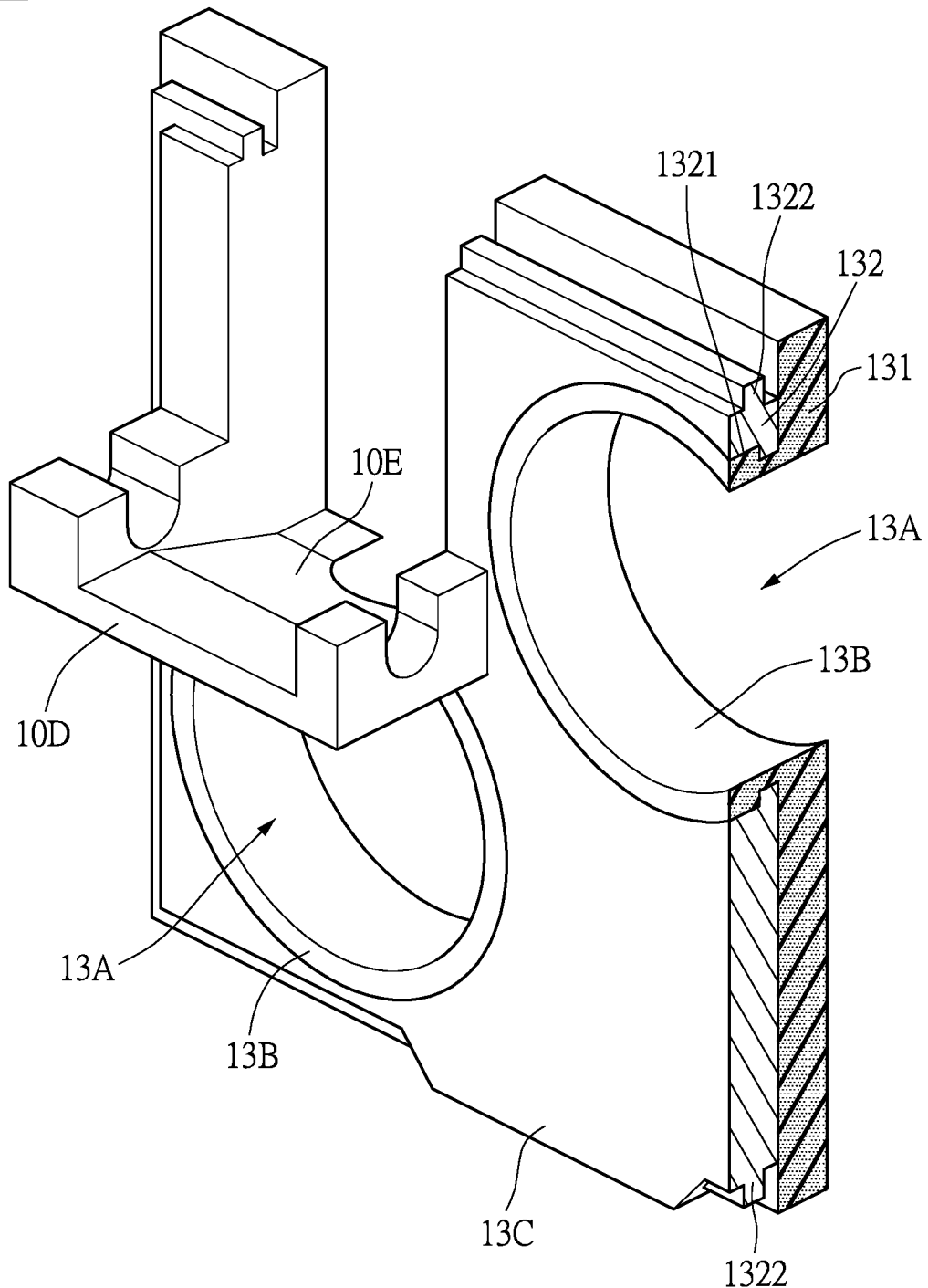
FIG. 8 is a cross-sectional perspective view of a front plate of the SFP transceiver according to the second embodiment of the present disclosure.
Figure 9:
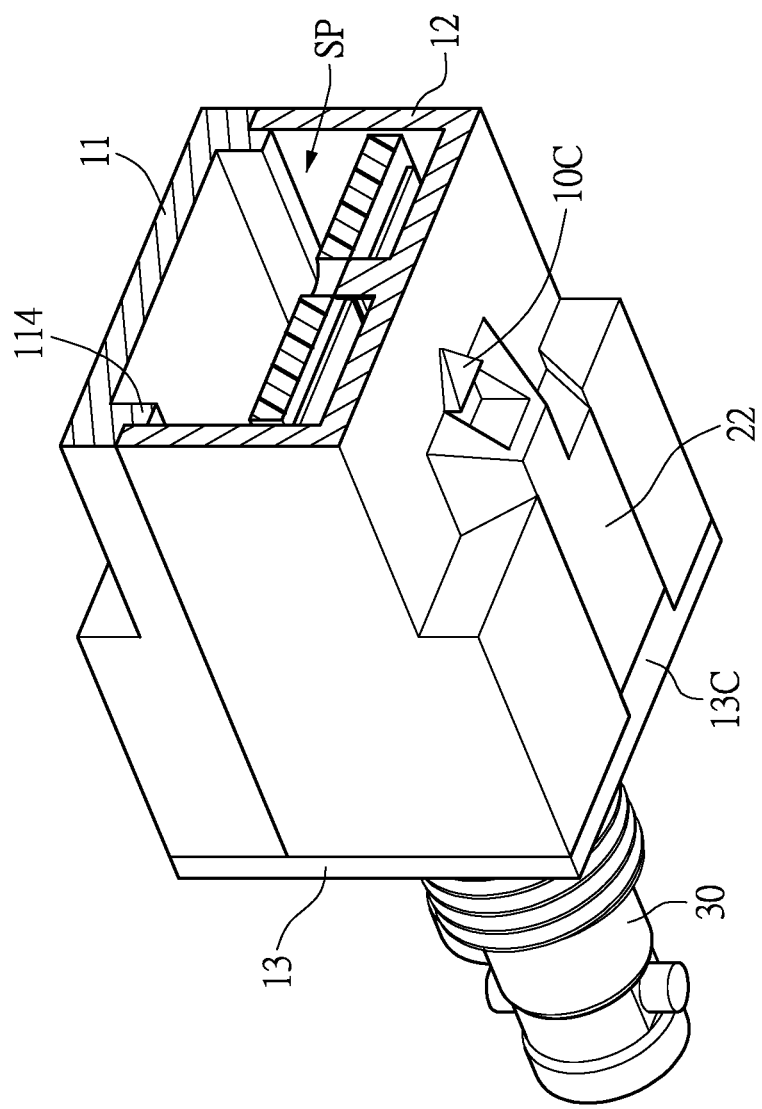
FIG. 9 is a cross-sectional perspective view of the SFP transceiver according to the second embodiment of the present disclosure.

As shown in FIGS. 8 and 9, the front plate 13 includes a plastic layer 131 and a metallic layer 132, which respectively define two opposite main surfaces of the front plate 13. The plastic layer 131 and the metallic layer 132 have two through holes 13A penetrating through the front plate 13, thereby respectively accommodating the two electrical signal connectors 30. The plastic layer 131 is disposed on (or stacked on) an outer surface of the metallic layer 132 and partially defines an outer surface of the housing 10, and an inner surface of the metallic layer 132 partially defines a boundary of the accommodating space SP. In practical applications, the metallic layer 132 and the plastic layer 131 can be formed by an injection-molding process.

The front plate 13 includes two plastic structures 13B respectively arranged in the two through holes 13A and connected to the metallic layer 132. When the two electrical signal connectors 30 are respectively disposed in the two through holes 13A, the two plastic structures 13B are located between the metallic layer 132 and the two electrical signal connectors 30, in which the two electrical signal connectors 30 are separated from the metallic layer 132 by the two plastic structures 13B. Moreover, the two plastic structures 13B are integrally connected to the plastic layer 131, thereby reinforcing the structural strength of the two plastic structures 13B. More specifically, the metallic layer 132 has two ring-shaped grooves 1321 formed on the inner surface thereof and partially defining the boundary of the accommodating space SP. The two grooves 1321 are respectively formed around and in air-communication with the two through holes 13A, and an aperture of each of the two grooves 1321 is larger than that of the corresponding through hole 13A. The two grooves 1321 are respectively filled with the two plastic structures 13B, thereby enhancing the connections between the two plastic structures 13B and the metallic layer 132.

Accordingly, the metallic layer 132 and the plastic layer 131 of the front plate 13 effectively shield external electromagnetic interference so that the signal transmission performance of the SFP transceiver 1' can be improved. It should be noted that the upper front plate 111 and the lower front plate 121 of the first embodiment can be formed of the plastic layer 131, the metallic layer 132, and the plastic structures 13B.

Figure 7:
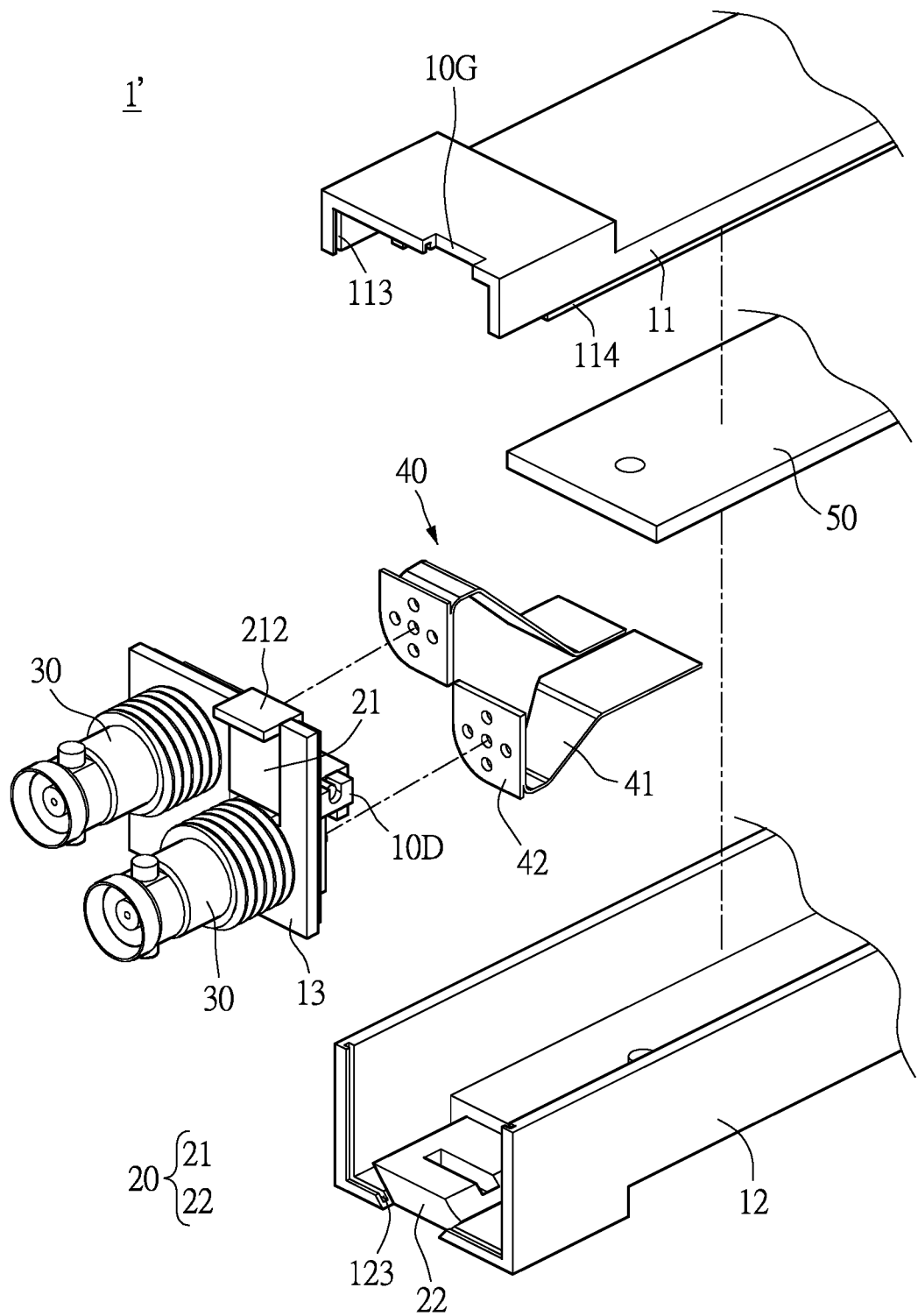
FIG. 7 is an exploded view of FIG. 6.

As shown in FIGS. 7 and 8, the metallic layer 132 includes a ring-shaped shielding structure 1322 arranged on an edge thereof, and the upper cover 11 and the lower cover 12 respectively includes a shielding structure 113, 123. When the front plate 13, the upper cover 11, and the lower cover 12 are assembled together, the shielding structure 1322 of the front plate 13 is engaged with the shielding structures 113, 123 of the upper cover 11 and the lower cover 12. Moreover, the shielding structure 1322 of the front plate 13 is a part of the metallic layer 132 so that the electromagnetic shielding effect of the SFP transceiver 1' can be effectively improved. An upper half part of the shielding structure 1322 of the front plate 13 and the shielding structures 113 of the upper cover 11 can be a convex structure and a concave structure respectively, and a lower half part of the shielding structure 1322 of the front plate 13 and the shielding structures 123 of the lower cover 12 can be a convex structure and a concave structure respectively, thereby enhancing the electromagnetic shielding effect of the SFP transceiver 1'. In addition, the connection strength of the front plate 13, the upper cover 11, and the lower cover 12 can be enhanced by the engagement of the shielding structure 1322 of the front plate 13 with shielding structure 113 123 of the upper cover 11 and the lower cover 12 respectively. The upper cover 11 and/or the lower cover 12 can be made of an anti-electromagnetic interference material, such as zinc alloy, and the shielding structure 1322 of the front plate 13 can also be made of an anti-electromagnetic interference material, such as zinc alloy. It should be noted that the pivotal structure 10D pivotally connected to the unlocking member 21 can be integrally formed with the metallic layer 132 and be regarded as a part of the front plate 13, thereby effectively enhancing the structural strength of the pivotal structure 10D. Furthermore, the limiting structure 10E can be integrally formed with the metallic layer 132 and be regarded as a part of the front plate 13.

As shown in FIG. 9, the upper cover 11 in the present embodiment has a protruding structure 114 corresponding in position to an inner wall of the lower cover 12. When the upper cover 11 and the lower cover 12 are assembled together, the protruding structure 114 abuts against the inner wall of the lower cover 12 such that the electromagnetic shielding performance of the upper cover 11 and the lower cover 12 is improved. In other embodiments of the present disclosure, the lower cover 12 can be formed with a structure similar to the protruding structure 114, i.e. the upper cover 11 and the lower cover 12 respectively include a protruding structure 114 and a structure similar thereto.

As shown in FIG. 8, the front plate 13 has a limiting portion 13C arranged on a lower part thereof and corresponding in position to the lower cover 12. When the front plate 13, the upper cover 11, and the lower cover 12 are assembled together, the limiting portion 13C is located at a front side of the track 122 to limit the motion of the interlock member 22. Moreover, the limiting portion 13C can be integrally formed with the metallic layer 132, thereby being provided with a better structural strength.

Figure 6:
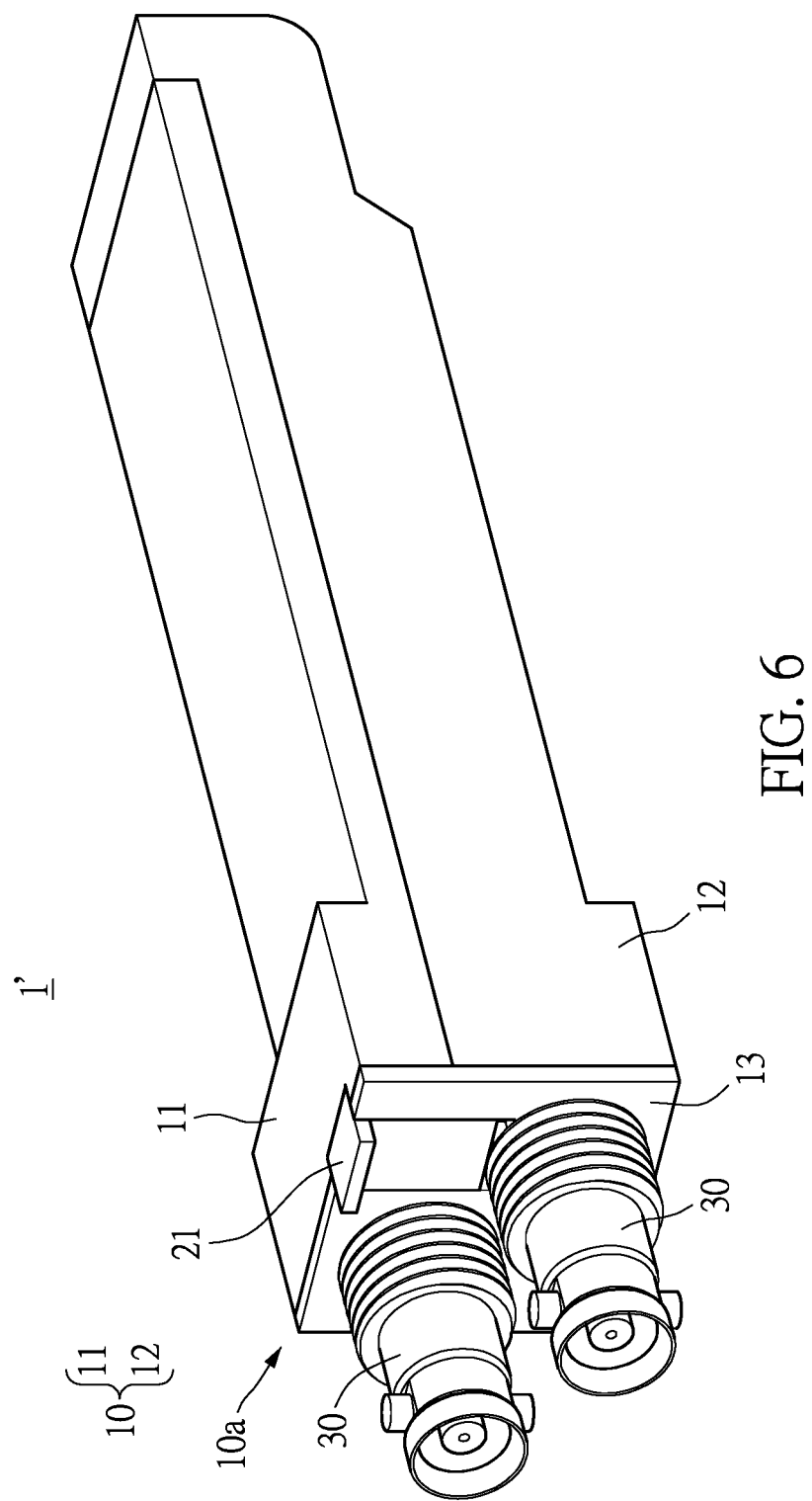
FIG. 6 is a perspective view showing the SFP transceiver according to a second embodiment of the present disclosure.
Figure 10:
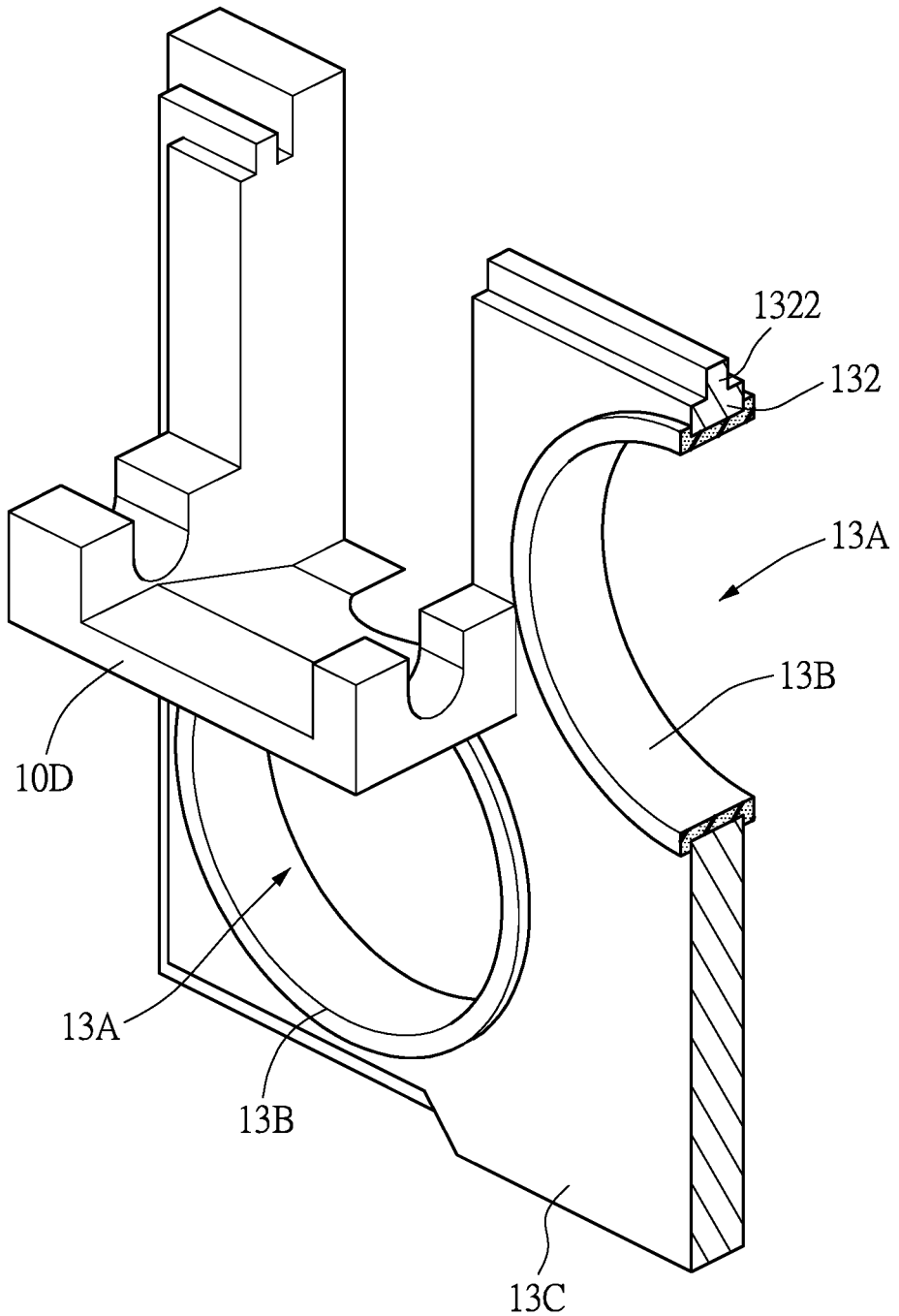
FIG. 10 is a cross-sectional perspective view of the front plate of the SFP transceiver of another structure according to the second embodiment of the present disclosure.

As shown in FIG. 10, the front plate 13 can be formed with another structure, which includes the metallic layer 132 and the two plastic structures 13B. In other words, the front plate 13 shown in FIG. 10 is provided without the plastic layer 131. Specifically, when the two electrical signal connectors 30 are fastened to the front plate 13 (as shown in FIG. 6), the two plastic structures 13B are still located between the metallic layer 132 and the two electrical signal connectors 30. Each of the two plastic structures 13B has a ring shape, and a thickness of a part of each plastic structure 13B arranged in the corresponding through hole 13A is less than that of the other part of each plastic structure 13B exposed at the metallic layer 132 so that the connection strength between the metallic layer 132 and the two plastic structures 13B can be enhanced.

Third Embodiment

Figure 11:
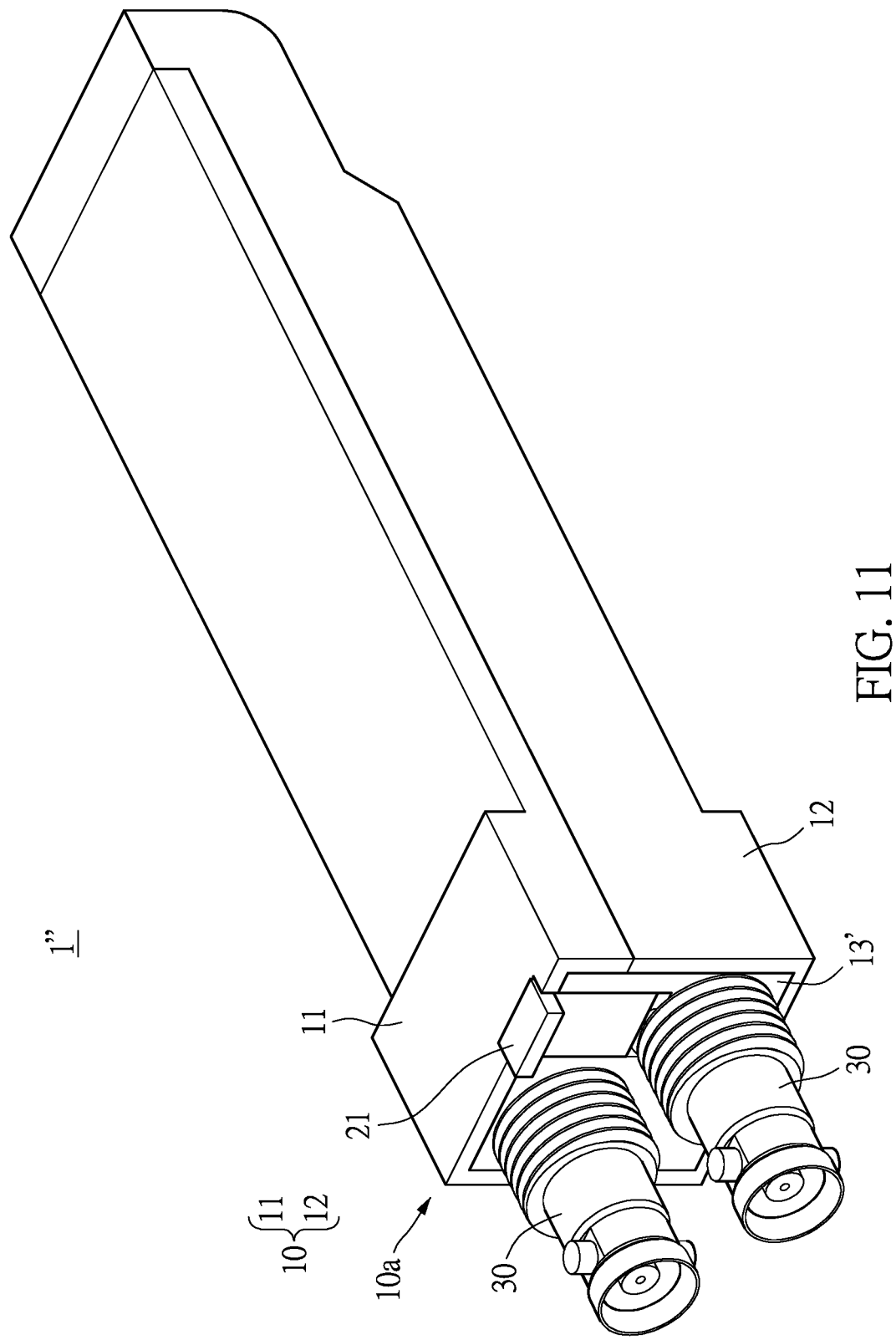
FIG. 11 is a perspective view showing the SFP transceiver according to a third embodiment of the present disclosure.
Figure 12:
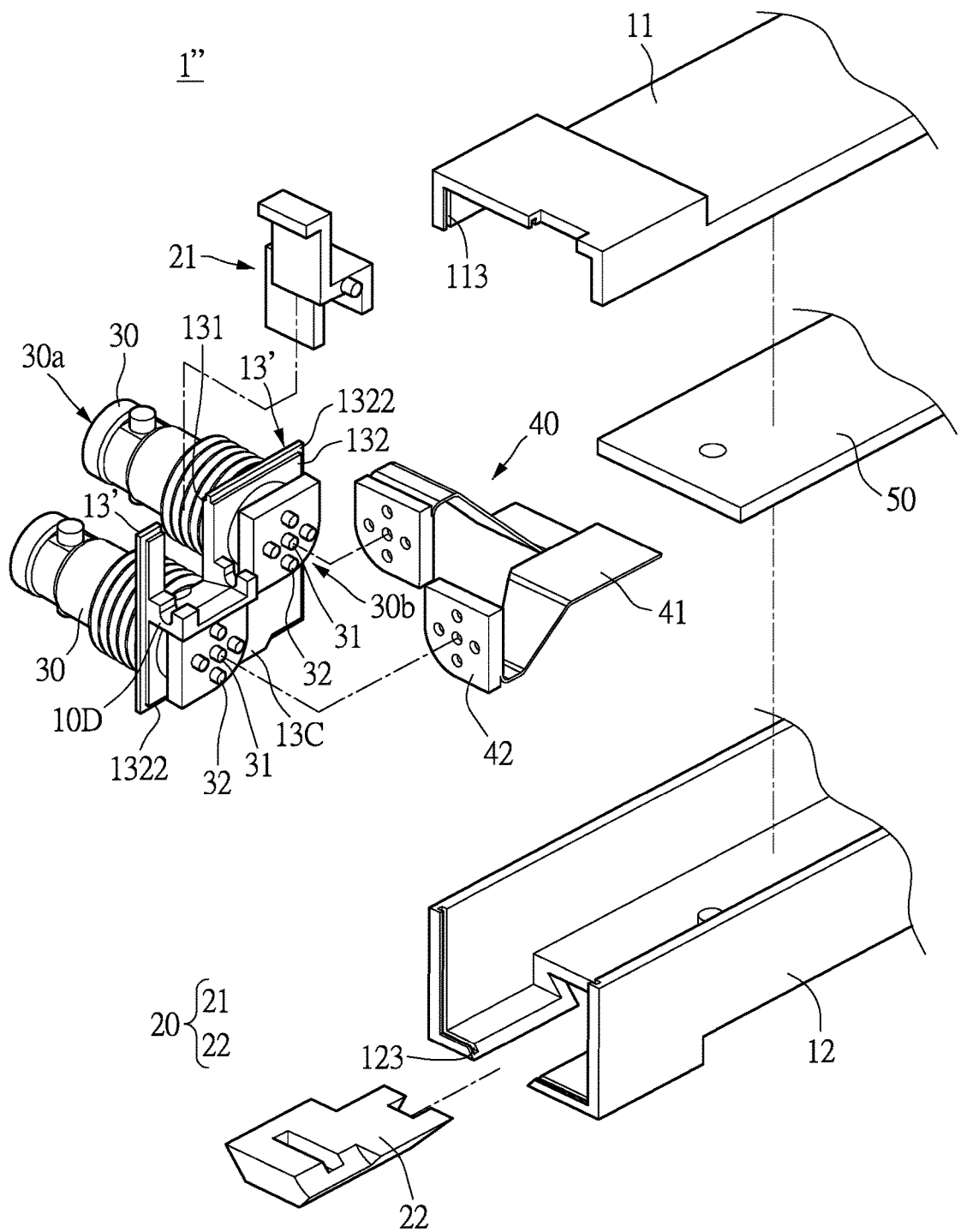
FIG. 12 is an exploded view of FIG. 11.

Reference is made to FIGS. 11 and 12, which illustrate the SFP transceiver 1'' according to a third embodiment of the present disclosure. The SFP transceiver 1'' in the present embodiment includes a housing 10, an unlocking assembly 20, two electrical signal connectors 30, two flexible assemblies 40, and a circuit board 50. The housing 10 in the present embodiment includes an upper cover 11, a lower cover 12, and a front plate 13'. The following description discloses the difference between the present embodiment and the first and second embodiments.

In the present embodiment, when the upper cover 11, the lower cover 12, and the front plate 13' are assembled together, an outer surface of the front plate 13' is coplanar with an end portion of the upper cover 11 and the lower cover 12, which are arranged around the outer surface of the front plate 13'. The front plate 13' of the present embodiment is substantially identical to that of the second embodiment. For example, the front plate 13' includes a plastic layer 131 and a metallic layer 132, which respectively define two opposite main surfaces of the front plate 13'; the plastic layer 131 defines a part of an outer surface of the housing 10, and an inner surface of the metallic layer 132 defines a part of a boundary of the accommodating space SP. Moreover, the detail description of the front plate 13' can be referred to the second embodiment.

The following description discloses other features of the present embodiment that are not described above. However, it should be noted that the following features of the present embodiment can also be applied to the first and second embodiments.

As shown in FIG. 12, each of the two electrical signal connectors 30 has an inserting end 30a and a connecting end 30b opposite the inserting end 30a. The inserting end 30a is arranged outside the front end 10a of the housing 10, and the connecting end 30b is arranged in the accommodating space SP. The circuit board 50 is fixed to the housing 10 and is arranged in the accommodating space SP. Each of the two flexible assemblies 40 has two opposite ends respectively and detachably connected to the circuit board 50 and the corresponding electrical signal connector 30. The SFP transceiver 1'' is configured to receive a signal, which travels from each of the two electrical signal connectors 30 to the circuit board 50 through the corresponding flexible assembly 40. Each of the two flexible assemblies 40, each of the electrical signal connectors 30, and the circuit board 50 can be independently tested before or after being assembled together. In the present embodiment, the two electrical signal connectors 30, the two flexible assemblies 40, and the circuit board 50 are detachably assembled together so that when one of the two electrical signal connectors 30, the two flexible assemblies 40, and the circuit board 50 fails, the SFP transceiver 1'' can be fixed by providing a substitute for the component that fails. It should be noted that the flexible assemblies 40 and the circuit board 50 are not composite boards.

In addition, the two electrical signal connectors 30, the two flexible assemblies 40, and the circuit board 50 are produced independently so as to achieve better impedance matching for the SFP transceiver 1'' by proper selections of the flexible assemblies 40 that match the two electrical signal connectors 30 and the circuit board 50, thereby enhancing the signal transmission performance of the SFP transceiver 1''. Furthermore, conventional electrical signal connectors are soldered on a circuit board, and the force generated from insertion and pulling the conventional electrical signal connectors will be exerted on the soldered joints between the conventional electrical signal connectors and the circuit board, which causes damage to conventional SFP transceivers. In the present disclosure, the two electrical signal connectors 30 are connected to the circuit board 50 through the two flexible assemblies 40 so that force generated from insertion and pulling of the electrical signal connectors 30 will mostly be absorbed by the flexible assemblies 40. Thus, the SFP transceiver 1'' of the present embodiment can solve the problems associated with the vulnerability of the soldered connections between the conventional electrical signal connector and the circuit board.

In practical applications, each electrical signal connector 30 includes a signal terminal and four grounding terminals 32 arranged on the connecting end 30b thereof, and each flexible assembly 40 has a plurality of positioning holes arranged on an end thereof. When each of the two electrical signal connectors 30 is connected to the corresponding flexible assembly 40, the signal terminal 31 and the four grounding terminal 32 are respectively inserted and soldered into the positioning holes.

As shown in FIG. 12, each of the two flexible assemblies 40 includes a flexible board 41 and a supporting plate 42, in which the supporting plate 42 is connected between an end of the flexible assembly 40 and the electrical signal connector 30, thereby enhancing the structural strength of the flexible board 41. In practical applications, a structural strength of the supporting plate 42 is larger than that of the flexible board 41; in other embodiments, the supporting plate 42 and the flexible board 41 are made of the same material.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A small form-factor pluggable (SFP) transceiver for being inserted into an electrical connection slot of an electronic apparatus, comprising a housing, wherein the housing includes:
    an upper cover;
    a lower cover fastened to the upper cover; and
    a front plate arranged between an end of the upper cover and an end of the lower cover, wherein the front plate, the upper cover, and the lower cover are assembled together so as to jointly define an accommodating space, wherein the front plate includes a metallic layer substantially defining a main surface thereof and two plastic structures connected to the metallic layer, the front plate has two through holes penetrating through the metallic layer for respectively accommodating two electrical signal connectors, and the two plastic structures are respectively arranged in the two through holes, wherein when the two electrical signal connectors are respectively disposed in the two through holes, the two plastic structures are arranged between the metallic layer and the two electrical signal connectors, and the two electrical signal connectors are separated from the metallic layer by the two plastic structures, wherein two opposite ends of the housing are respectively defined as a front end and a rear end, and the front plate is located at the front end.

2. The SFP transceiver as claimed in claim 1, wherein the front plate includes a plastic layer disposed on an outer surface of the metallic layer and connected to the two plastic structures, and an inner surface of the metallic layer defines a part of the boundary of the accommodating space.

3. The SFP transceiver as claimed in claim 1, wherein the metallic layer includes a ring-shaped shielding structure arranged on an edge thereof, and the upper cover and the lower cover each include a shielding structure, wherein the shielding structure of the metallic layer is engaged with the shielding structures of the upper cover and the lower cover.

4. The SFP transceiver as claimed in claim 1, wherein the metallic layer has two ring-shaped grooves formed in an inner surface thereof defining a part of the boundary of the accommodating space, the two grooves are respectively formed around and in air-communication with the two through holes, and an aperture of each of the two grooves is larger than that of the corresponding through hole.

5. The SFP transceiver as claimed in claim 1, wherein the upper cover and the lower cover are made of a zinc alloy, one of the upper cover and the lower cover having a protruding structure abutting an inner wall of the other one of the upper cover and the lower cover.

6. The SFP transceiver as claimed in claim 1, wherein the housing includes a top surface, a bottom surface opposite to the top surface, and an engaging portion disposed on the bottom surface, wherein when the SFP transceiver is inserted into the electrical connection slot, the engaging portion is engaged with the electrical connection slot; the SFP transceiver further comprises:

an unlocking member pivotally connected to the housing and located at the front end, wherein the unlocking member includes a manipulating portion exposed at the front end and arranged adjacent to the top surface, and the manipulating portion is configured to be rotated in a direction away from the front end and the top surface by an external force; and an interlock member movably disposed on the housing, wherein when the manipulating portion is rotated in the direction away from the front end and the top surface, the unlocking member moves the interlock member such that the engaging portion is released from the engagement with the electrical connection slot.

7. The SFP transceiver as claimed in claim 6, wherein a part of the interlock member is exposed at the bottom surface, the interlock member includes a slot formed in a side portion thereof, and the unlocking member includes a driving portion engaged with the slot, wherein when the unlocking member is rotated in the direction away from the front end and the top surface, the driving portion presses an inner wall of the slot to move the interlock member relative to the housing such that the engaging portion is released from the engagement with the electrical connection slot.

8. The SFP transceiver as claimed in claim 6, wherein the front plate includes a pivotal structure arranged in the accommodating space, and the unlocking member is pivotally connected to the pivotal structure of the housing.

9. The SFP transceiver as claimed in claim 6, wherein the housing includes a limiting structure configured to limit a rotation angle of the unlocking member with respect to the housing.

10. The SFP transceiver as claimed in claim 6, wherein the front plate includes a front opening, the upper cover includes a top opening, and the front opening is in air-communication with the top opening, wherein the unlocking member covers the front opening and the top opening, and a distance between the unlocking member and a side wall defining the top opening is less than 0.5 mm.

* * * * *